United States Patent [19]
Magee et al.

[11] Patent Number: 5,892,367
[45] Date of Patent: Apr. 6, 1999

[54] THERMAL BOX FOR A SEMICONDUCTOR TEST SYSTEM

[75] Inventors: Allan R. Magee; Robert W. Creed; Steve A. Loisate, all of Boise, Id.

[73] Assignee: MCMS, Inc., Nampa, Id.

[21] Appl. No.: 553,763

[22] Filed: Oct. 23, 1995

[51] Int. Cl.$^6$ ................................................. G01R 31/02
[52] U.S. Cl. .......................................................... 324/760
[58] Field of Search ................................... 324/760, 754, 324/72.5, 158.1, 73.1, 765; 269/21; 361/694, 796; 165/80.4, 104.33

[56] References Cited

U.S. PATENT DOCUMENTS

| | | | |
|---|---|---|---|
| 3,710,251 | 1/1973 | Hagge et al. | 324/760 |
| 4,694,245 | 9/1987 | Frommes | 324/754 |
| 4,745,354 | 5/1988 | Fraser | 165/104.33 |
| 4,757,255 | 7/1988 | Margozzi | 324/760 |
| 4,962,355 | 10/1990 | Holderfield et al. | 324/760 |
| 5,027,063 | 6/1991 | Letourneau | 324/754 |
| 5,099,196 | 3/1992 | Longwell et al. | 324/158 |
| 5,237,267 | 8/1993 | Harwood et al. | 324/758 |
| 5,256,964 | 10/1993 | Ahmad et al. | 324/158 |
| 5,262,716 | 11/1993 | Gregory, Jr. et al. | 324/158 |
| 5,289,116 | 2/1994 | Kurita et al. | 324/158 |
| 5,381,344 | 1/1995 | Rohrbaugh et al. | 364/490 |
| 5,390,131 | 2/1995 | Rohrbaugh et al. | 364/490 |
| 5,400,263 | 3/1995 | Rohrbaugh et al. | 364/490 |
| 5,528,157 | 6/1996 | Newberry et al. | 324/760 |

*Primary Examiner*—Vinh P. Nguyen
*Attorney, Agent, or Firm*—Margaret M. Dunbar

[57] ABSTRACT

Disclosed is a thermal environment enclosure for a semiconductor test system, said enclosure comprising a housing having an exterior surface, an interior chamber and a window therethrough. The housing further comprised of a substantially rectangular top, a pair of substantially rectangular side walls, a front wall, a back wall, a top perimeter edge, and a bottom perimeter edge with an attached sealing gasket. The bottom perimeter edge defines an opening into the interior chamber which is configured for sealed mating with the recessed test area to define a imposed thermal environment test area. The top of the housing comprises a hingeably attached lid with a closing latch, the lid including an attached interior surface sealing gasket defining the interior chamber in combination with other walls when the lid is closed. The housing also includes a flange circumscribing the bottom perimeter edge of the housing, with attachment mounts for removeably attaching the enclosure to the front surface of the semiconductor test system and a seal attached to the flange bottom surface for mating with the front surface of the test system to define a sealed interface between the flange and test system front surface. The enclosure further includes a supply line conduit passing through a side wall into the interior chamber, said conduit including a diffuser outlet located in the interior chamber.

4 Claims, 3 Drawing Sheets

THERMAL BOX FOR A SEMICONDUCTOR TEST SYSTEM

BACKGROUND OF THE INVENTION

1. Technical Field

The present invention relates generally to an apparatus to be used with semiconductor test systems, and more specifically to an apparatus for imposing a thermal environment when using a semiconductor test system.

2. Background

The advanced state of the art of electronic devices is apparent from the diversity of the functions and good performance of such devices, particularly in view of their small size. Analytical methods are usually applied to evaluate and characterize newly manufactured semiconductor wafers and devices. It is only through the use of accurate characterization and evaluation that improved devices can be successfully fabricated.

The testing of integrated circuits (IC's) during engineering development and production is performed by an IC tester such as a Hewlett Packard HP82000 tester, manufactured by Hewlett-Packard company, Palo Alto, Calif. Such board testers are widely used in the electronics industry as a tool for troubleshooting and performance evaluation and verification.

While characterizing IC chips and the like, environmental factors, such as variations in temperature, humidity, etc., can be a source of inaccuracy if not included in the test variables. One objective of environmental testing in the characterization of an IC chip is to predict the ranges in which a given device will function and to assure that design specifications are being met. Environmental or thermal testing provides a tool to aid in designing IC chips and devices with performance tolerances that prevent failure rates, due to environment-activated failure mechanisms and from exceeding acceptable limits for a particular application.

True at-speed wafer testing is a time consuming process with many hardware dependencies. Accordingly, it takes a substantial amount of time to ready a testing device, such as the Hewlett Packard HP82000 tester and it is difficult and undesirable to interrupt the tester during a procedure. Furthermore, a substantial amount of time is required to test each IC device. Therefore, the user would generally want to monitor as many parameters as possible during testing, including environmental conditions and thermal tolerances for the device under test.

This invention uses a standard tester such as the HP82000 and allows IC semiconductor chips to be tested for environmental tolerances during product characterization.

SUMMARY OF THE INVENTION

The invention is a thermal environment enclosure for a semiconductor test system comprising a housing having an exterior surface, an interior chamber and a window therethrough. The housing further having a substantially rectangular top, a pair of substantially rectangular side walls, a front wall, a back wall, a top perimeter edge, and a bottom perimeter edge. The bottom perimeter edge includes an attached sealing means, and defines an opening into the interior chamber which is configured for sealed mating with the recessed test area to enclose a thermal environment test area. The top of the housing comprises a hingeably attached lid with a closing means. The lid includes an attached interior surface sealing means for mating with the housing top perimeter edge and defining the interior chamber when the lid is in a closed orientation. The housing also includes a flange circumscribing the bottom perimeter edge of the housing, with a plurality of attachment means for removeably attaching the enclosure to the front surface of the semiconductor test system and a sealing means attached to the bottom surface of the flange for mating with the front surface of the test system to define a sealed interface between the flange and test system front surface. The enclosure further includes a supply line conduit passing through a side wall into the interior chamber, said conduit including a diffuser outlet located in the interior chamber.

Additional, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims

DETAILED DESCRIPTION OF THE INVENTION

Figure 1:
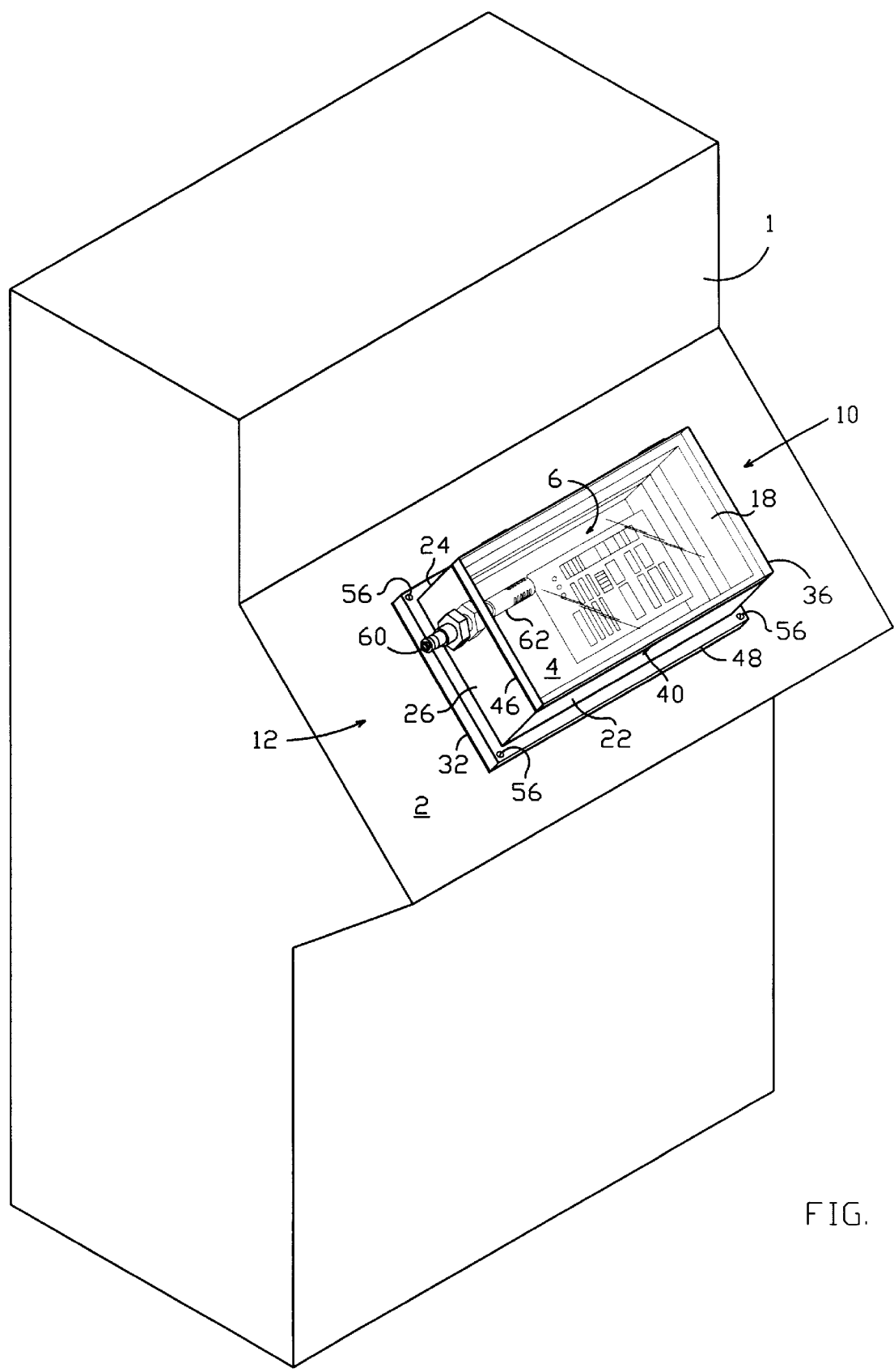
FIG. 1 shows an IC tester with the thermal environment enclosure in use thereon.
Figure 2:
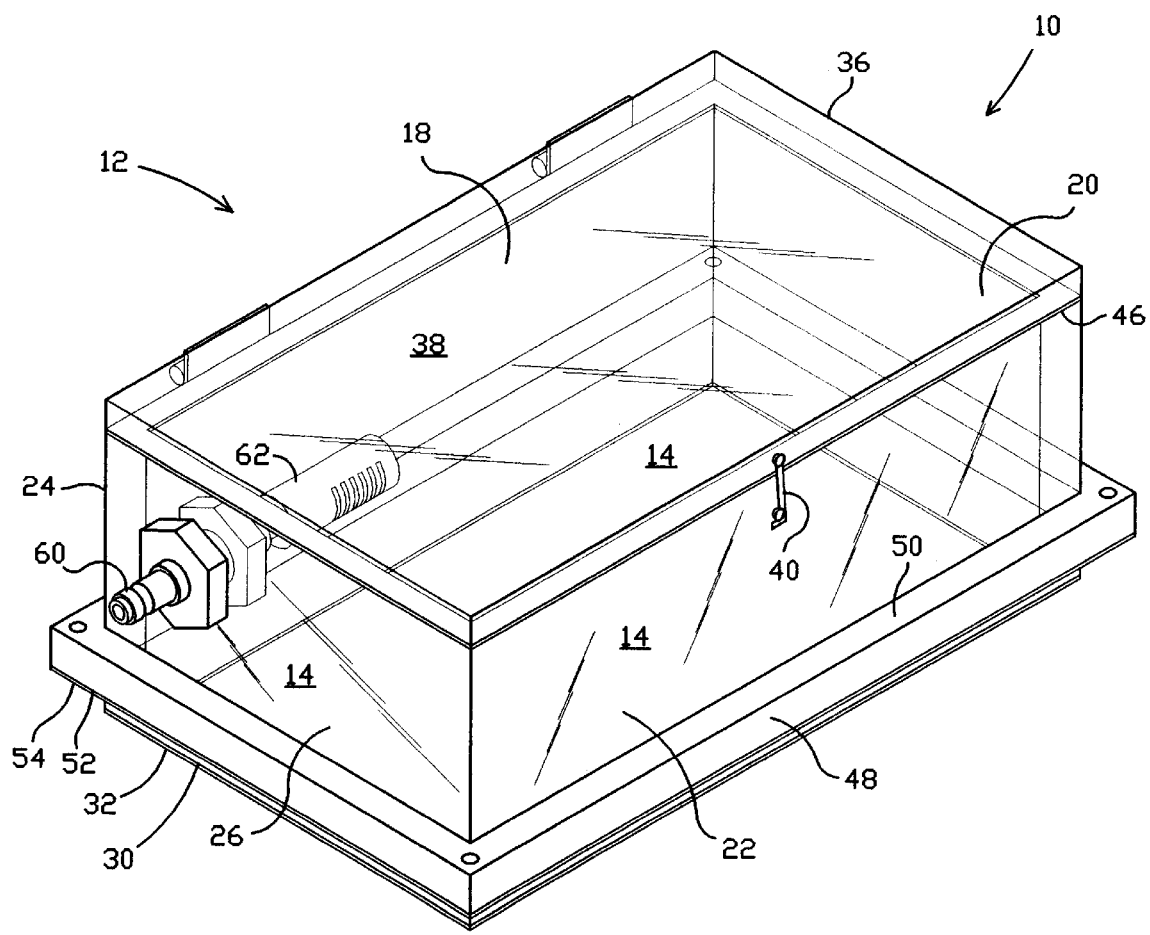
FIG. 2 is a three quarter elevation view of the thermal environment enclosure with the lid closed.
Figure 3:
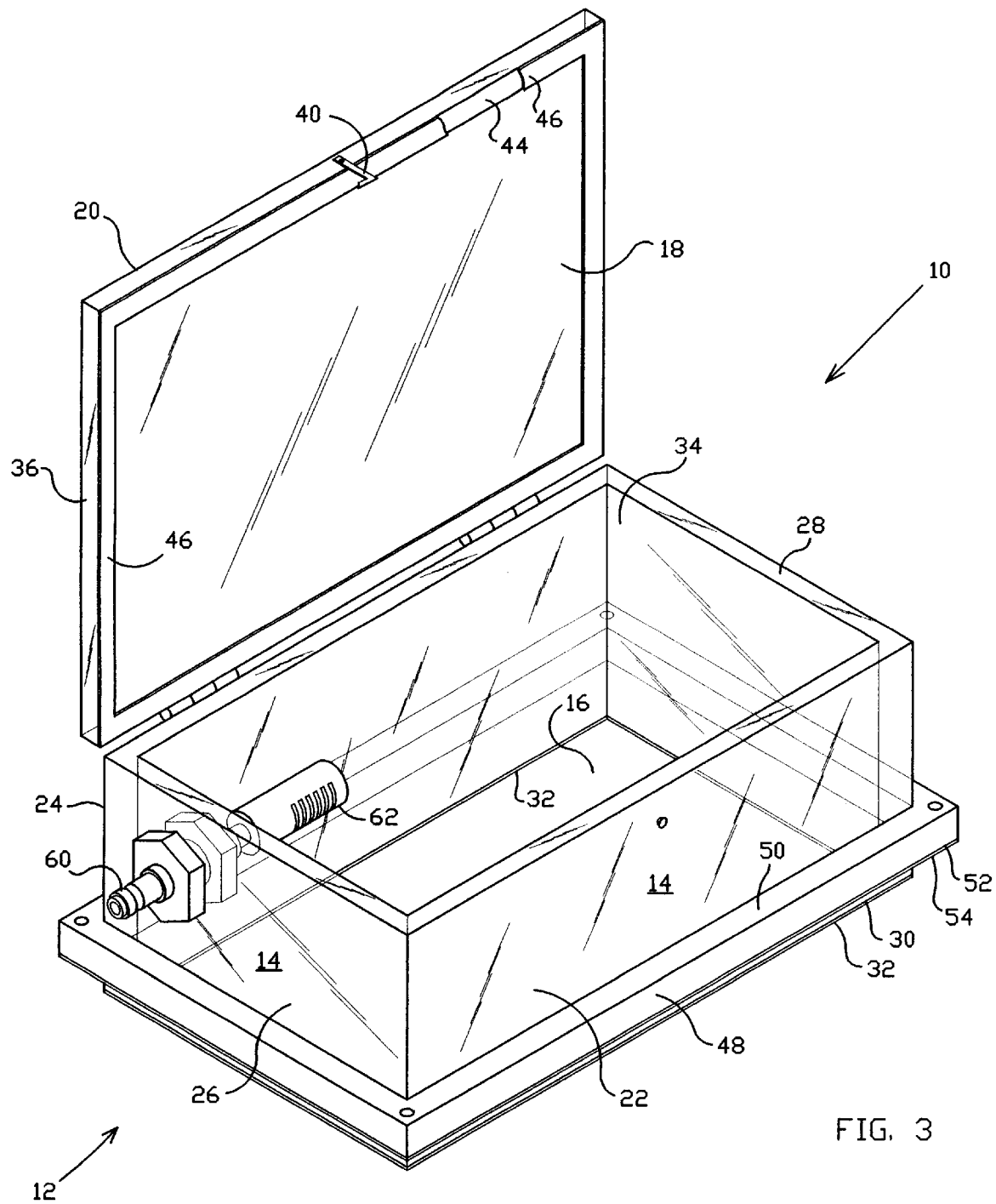
FIG. 3 is a three quarter elevation view of the thermal environment enclosure with the lid open.

Referring now to FIGS. 1–3, a preferred exemplary embodiment of the invention will be described in detail. Enclosure 10 is generally comprised of housing 12, having an exterior surface 14, interior chamber 16, window 18, supply line conduit 60 and sealing means 32.

In the preferred embodiment housing 12 is comprised of substantially rectangular top 20, front wall 22, back wall 24, and a pair of substantially rectangular side walls 26, as can be seen in FIGS. 1–3. In the preferred embodiment housing 12 is made out of transparent acrylic plastic and the entire top 20 constitutes window 18. In other embodiments housing 12 can be made from opaque materials and include window 18 of a size and placement in housing 12 that allows viewing of interior chamber 16.

Front wall 22 and back wall 24 are of equal size and in parallel juxtaposition, spaced apart by the pair of side walls 26. The four walls 22, 24 and pair of 26 connect at 90° angles, forming a substantially rectangular structure with a top perimeter edge 28 and a bottom perimeter edge 30, as can be seen in FIGS. 2 and 3. Bottom perimeter edge 30 defines opening 34 into interior chamber 16 of housing 12. Bottom perimeter edge 30 his bottom perimeter edge sealing means 32, here in the form of a silicon gasket, attached to it for sealable mating with the bottom 4 surface of recessed test area 6 of the HP82000.

Top 20 of housing 12, in the preferred embodiment, is comprised of lid 36 which is hingeably attached, here to back wall 24, by any well known hinging means, here a pair of door hinges as can be seen in FIGS. 2 and 3. Lid 36 includes lid exterior surface 38, interior surface 42 and lid interior surface perimeter edge 44. Lid perimeter 44 has lid perimeter edge sealing means 46, here a silicon gasket, attached to it for forming a sealed contact between lid 36 and top perimeter edge 28 of housing 12 when lid 36 is in the closed orientation, as can best be seen in FIGS. 2 and 3. Lid exterior surface 38 includes a plurality of closing means 40, here a simple swivel angle bar that can be latched around a screw threaded into front wall 22. Examples of other appropriate closing means include a pair of buckle clamps, one or more slide bar latches, and similar mechanisms.

In the preferred embodiment housing 12 is further comprised of flange 48 circumscribing bottom perimeter 30. Flange 48 includes top surface 50 and bottom surface 52. Flange 48 has flange sealing means 54 attached to flange bottom surface 52 for sealable mating with front surface 2 of the HP82000 test system. A plurality of attachment means 56 are located on flange 48 to allow for secure attachment of housing 12 to the inclined front surface 2 of the HP82000 test system. Here attachment means 56 consists of four screws located on flange 48 at the intersection of each of walls 22, 24 and pair of 26, or corners, of housing 12.

Supply line conduit 60 is located in a side wall 26, preferably near back wall 24. Here conduit 60 is comprised of a threaded compression fitting for flexible hosing, threaded through a side wall 26 with an optional locking nut on conduit 60 on both the exterior side and interior chamber side of side wall 26. The portion of conduit 60 located in interior chamber 16 further includes diffuser outlet 62. Diffuser outlet 62 in the preferred embodiment is a diffuser nozzle head with a plurality of small slits, nozzle 62 being threadably attached to conduit 60, as can be seen in FIGS. 1–3.

In use, enclosure 10 is placed on front surface 2 of the HP82000 test system, with flange bottom surface 52 resting on front surface 2 of the test system. Screws 56 are threadably engaged with front surface 2 of the HP82000, thereby forming a sealed interface between flange sealing gasket 54 and HP82000 front surface 2 as well as a sealed interface between housing bottom perimeter edge sealing gasket 32 and the bottom surface 4 of the HP82000 recessed test area 6. Lid 36 can then be opened, if it is not already open, and the desired semiconductor device to be tested can be appropriately placed in the HP82000 test area. Lid 36 is then closed and lid interior sealing gasket 46 then forms a seal with housing top perimeter edge 28. Lid 36 is then secured by closing means 40. A supply line hosing is attached on one end to the portion of conduit 60 located on the exterior of housing 12 and on the hose's opposite end to an appropriate supply source for introducing imposed environmental conditions, primarily with regard to temperature to interior chamber 16 via nozzle 62.

While there is shown and described the preferred embodiment of the invention, it is to be distinctly understood that this invention is not limited thereto but may be variously embodied to practice within the scope of the following claims.

I claim:

1. A thermal environment enclosure for a semiconductor test system, the test system having a front surface with a recessed test area having a bottom surface and being defined by bordering surfaces of the front surface, said enclosure comprising:

a) a housing having an exterior surface, an interior chamber and a window therethrough, said housing further having a substantially rectangular top, a pair of substantially rectangular side walls, a front wall, a back wall, a top perimeter edge, and a bottom perimeter edge defining an opening into the interior chamber;

b) a bottom perimeter edge sealing means attached to the bottom perimeter edge configured for mating with the bottom surface of the recessed test area to define a sealed imposed thermal environment test area;

c) a supply line conduit passing through a side wall into the interior chamber, said conduit including a diffuser outlet located in the interior chamber;

d) wherein the top of the housing comprises a hingeably attached lid having an exterior surface with a closing means and an interior surface, the interior surface forming the interior chamber of the housing in combination with the pair of side walls, front wall and back wall, the interior surface of the top including an interior surface perimeter edge with a sealing means attached thereto defining the interior chamber when the lid is in a closed orientation;

e) a flange having a top surface and a bottom surface, the flange being attached to and circumscribing the bottom perimeter edge of the housing;

f) a flange sealing means attached to the bottom surface of the flange for mating with the front surface of the test system to define a sealed interface between the flange and test system front surface; and g) a plurality of attachment means for removeably attaching the flange to the front surface of the semiconductor test system.

2. The thermal environment enclosure of claim 1 wherein the housing is constructed from transparent material.

3. A thermal environment enclosure in combination with a semiconductor test system the test system having a front surface with a recessed test area having a bottom surface and being defined by bordering surfaces of the front surface, said enclosure comprising:

a) a housing having an exterior surface, an interior chamber and a window therethrough, said housing further having a substantially rectangular top, a pair of substantially rectangular side walls, a front wall, a back wall, a top perimeter edge, and a bottom perimeter edge defining an opening into the interior chamber;

b) a bottom perimeter edge sealing means attached to the bottom perimeter edge configured for mating with the bottom surface of the recessed test area to define a sealed imposed thermal environment test area;

c) a supply line conduit passing through a side wall into the interior chamber, said conduit including a diffuser outlet located in the interior chamber;

d) wherein the top of the housing comprises a hingeably attached lid having an exterior surface with a closing means and an interior surface, the interior surface forming the interior chamber of the housing in combination with the pair of side walls, front wall and back wall, the interior surface of the top including an interior surface perimeter edge with a sealing means attached thereto defining the interior chamber when the lid is in a closed orientation;

e) a flange having a top surface and a bottom surface, the flange being attached to and circumscribing the bottom perimeter edge of the housing;

f) a flange sealing means attached to the bottom surface of the flange for mating with the front surface of the test system to define a sealed interface between the flange and test system front surface; and g) a plurality of attachment means for removeably attaching the flange to the front surface of the semiconductor test system.

4. The thermal environment enclosure of claim 3 wherein the housing is constructed from transparent material.

* * * * *